US012641759B2

(12) United States Patent
Koledov et al.

(10) Patent No.: US 12,641,759 B2
(45) Date of Patent: May 26, 2026

(54) ELECTRICAL PACKAGE

(71) Applicant: Power Solutions International, Inc.,
Wood Dale, IL (US)

(72) Inventors: Aleks Koledov, Williams Bay, WI
(US); Curtis W. Boyd, White Lake, MI
(US); Robert Shailes, Fishers, IN (US);
Steven Gnoffo, Elk Grove Village, IL
(US); Brandon Higgins, Palatine, IL
(US); Kevin Kendzierski, Wadsworth,
IL (US); Carlos Lara, Palatine, IL (US)

(73) Assignee: Power Solutions International, Inc.,
Wood Dale, IL (US)

( * ) Notice: Subject to any disclaimer, the term of this
patent is extended or adjusted under 35
U.S.C. 154(b) by 0 days.

(21) Appl. No.: 19/272,886

(22) Filed: Jul. 17, 2025

(65) Prior Publication Data

US 2025/0344359 A1     Nov. 6, 2025

Related U.S. Application Data

(63) Continuation of application No.
PCT/US2024/054302, filed on Nov. 1, 2024.

(Continued)

(51) Int. Cl.
*H05K 7/20*          (2006.01)
*H05K 5/02*          (2006.01)
(52) U.S. Cl.
CPC ....... *H05K 7/20927* (2013.01); *H05K 5/0217*
(2013.01); *H05K 7/20909* (2013.01)
(58) Field of Classification Search
CPC ............. H05K 7/20927; H05K 5/0217; H05K
7/20909; Y02T 10/70; Y02T 10/64; Y02T 10/7072; Y02T 10/72; Y02T 10/62; Y02T
90/12; Y02T 90/40; Y02T 10/92; Y02T
90/14; Y02T 90/16; Y02T 90/167; B60L
1/003; B60L 2200/40; B60L 2210/30;
B60L 2210/40; B60L 15/007; B60L
3/0046;

(Continued)

(56) References Cited

U.S. PATENT DOCUMENTS 5,441,297 A * 8/1995 Krohn ........................ B62B 1/26
280/655
5,787,693 A * 8/1998 Dyke ..................... A01D 34/78
56/2

(Continued)

FOREIGN PATENT DOCUMENTS

GB          2412636        10/2005
JP          4243954 B2 *   3/2009    ......... H05K 7/20927

(Continued)

OTHER PUBLICATIONS

International Search Report and Written Opinion prepared by the
U.S. Patent Office in application No. PCT/US2024/054302 dated
Feb. 5, 2025.

*Primary Examiner* — Jared Fureman
(74) *Attorney, Agent, or Firm* — McDonnell Boehnen
Hulbert & Berghoff LLP

(57)          ABSTRACT

An electrical package comprises at least one battery, at least
one electrical motor, a battery charger used to charge the at
least one battery, a power converter, a cooling system, and
a control system comprising at least one processor and a
non-transitory computer readable medium.

20 Claims, 20 Drawing Sheets

600 ⟶

Related U.S. Application Data

(60) Provisional application No. 63/547,334, filed on Nov. 3, 2023.

(58) Field of Classification Search
CPC ...... B60L 53/80; H02K 11/0094; H02K 7/14; H02K 5/04
See application file for complete search history.

(56) References Cited

U.S. PATENT DOCUMENTS

| | | | | |
|---|---|---|---|---|
| 5,831,409 | A * | 11/1998 | Lindberg | B60L 50/51 |
| | | | | 318/811 |
| 7,149,099 | B2 | 12/2006 | Asbery | |
| 8,508,058 | B2 * | 8/2013 | Hamilton | H02J 3/46 |
| | | | | 290/1 R |
| 9,991,825 | B1 * | 6/2018 | Ackerman | H02P 7/06 |
| 10,126,741 | B2 * | 11/2018 | Gates | B60L 58/10 |
| 10,442,481 | B2 * | 10/2019 | Podolefsky | E02F 9/0866 |
| 10,532,647 | B2 * | 1/2020 | Colavincenzo | B60W 20/15 |
| 10,749,224 | B2 * | 8/2020 | Podolefsky | H01M 50/224 |
| 11,114,878 | B2 | 9/2021 | Hansen et al. | |
| 11,271,415 | B2 | 3/2022 | Mueckl et al. | |
| 11,476,527 | B2 | 10/2022 | Sheeks et al. | |
| 11,505,084 | B2 * | 11/2022 | Koga | B65F 3/02 |
| 11,518,273 | B2 * | 12/2022 | Tokozakura | H01M 10/625 |
| 11,621,662 | B2 * | 4/2023 | White | B60L 3/08 |
| | | | | 318/139 |
| 11,632,066 | B2 | 4/2023 | Dallas et al. | |
| 11,638,842 | B2 | 5/2023 | McCarthy et al. | |
| 11,652,437 | B2 | 5/2023 | Sheeks et al. | |
| 11,658,546 | B2 * | 5/2023 | Sprague | H01M 50/204 |
| | | | | 310/68 D |
| 11,673,477 | B2 * | 6/2023 | Sopko, Jr. | B60L 50/66 |
| | | | | 60/221 |
| 11,791,687 | B2 * | 10/2023 | Sprague | H02K 7/1815 |
| | | | | 310/68 R |
| 11,959,251 | B2 | 4/2024 | Kaneda et al. | |
| 11,984,747 | B2 * | 5/2024 | Mitri | H02J 7/0013 |
| 12,040,732 | B2 * | 7/2024 | Abbott | H02K 7/1815 |
| 12,074,333 | B2 * | 8/2024 | Obermann | H02P 6/085 |
| 12,344,123 | B2 * | 7/2025 | Sugiura | H01M 10/625 |
| 12,418,220 | B2 * | 9/2025 | Sprague | H01M 50/244 |
| 2005/0096661 | A1 | 5/2005 | Farrow et al. | |
| 2009/0127010 | A1 * | 5/2009 | Morrow et al. | |
| 2011/0094129 | A1 * | 4/2011 | Rowe | E01H 5/045 |
| | | | | 37/246 |
| 2012/0153884 | A1 * | 6/2012 | Lindsey | B60L 53/12 |
| | | | | 318/500 |
| 2012/0262018 | A1 * | 10/2012 | Thiara | H02K 53/00 |
| | | | | 74/DIG. 9 |
| 2016/0340861 | A1 | 11/2016 | Takeo | |
| 2017/0043823 | A1 * | 2/2017 | Podolefsky | H02P 25/02 |
| 2017/0271939 | A1 * | 9/2017 | Kaneko | H02K 5/10 |
| 2018/0138839 | A1 * | 5/2018 | Puzio | H02K 11/28 |
| 2018/0217587 | A1 * | 8/2018 | Gates | B60L 58/10 |
| 2018/0331597 | A1 * | 11/2018 | Schulenberg | H02K 11/0094 |
| 2019/0140474 | A1 * | 5/2019 | Stoltz | B60K 25/06 |
| 2019/0238083 | A1 * | 8/2019 | White | H01M 50/20 |
| 2021/0143710 | A1 * | 5/2021 | Sprague | H02K 7/116 |
| 2022/0063080 | A1 | 3/2022 | Nance | |
| 2022/0255339 | A1 | 8/2022 | Stoltz et al. | |
| 2022/0305938 | A1 * | 9/2022 | Healy | H02J 7/0045 |
| 2023/0089286 | A1 * | 3/2023 | Jimenez | A01C 17/005 |
| | | | | 701/22 |
| 2023/0131436 | A1 | 4/2023 | Kitahara | |
| 2023/0208152 | A1 | 6/2023 | Stanke et al. | |
| 2023/0216321 | A1 | 7/2023 | Loudon et al. | |
| 2023/0294553 | A1 | 9/2023 | Kim | |
| 2023/0311638 | A1 * | 10/2023 | Mikuni | B60K 1/00 |
| | | | | 180/68.4 |
| 2023/0323846 | A1 | 10/2023 | Ishi | |
| 2023/0415611 | A1 | 12/2023 | Moriguchi et al. | |
| 2023/0417022 | A1 | 12/2023 | Kitahara | |
| 2024/0051405 | A1 | 2/2024 | Morishita et al. | |
| 2024/0060270 | A1 | 2/2024 | Kaneda et al. | |
| 2024/0125093 | A1 | 4/2024 | Kaneda et al. | |
| 2024/0133156 | A1 | 4/2024 | Muraoka et al. | |
| 2024/0167249 | A1 | 5/2024 | Kaneda et al. | |
| 2024/0175238 | A1 | 5/2024 | Kitahara | |
| 2024/0304901 | A1 * | 9/2024 | Suzuki | H01M 10/625 |
| 2025/0084616 | A1 | 3/2025 | Belsner et al. | |

FOREIGN PATENT DOCUMENTS

| | | | | |
|---|---|---|---|---|
| KR | 20160119986 A | * | 10/2016 | ........ F16H 57/0476 |
| KR | 102531668 B1 | * | 5/2023 | ............. B60L 50/60 |
| WO | 2022157470 | | 7/2022 | |

* cited by examiner

300

| Motor Rated/Peak Power 304 | 30/60 KW |
|---|---|
| Motor Rated/Peak Torque 306 | 100/200 Nm |
| Motor Rated Speed 308 | 3000 RPM |
| Motor Cooling Type 310 | Liquid |
| Battery Energy 312 | 30 kWh |
| Battery Type 314 | LTC |
| Max Continues Charge/discharge Rate 316 | 1C |
| Max Pulse Charge/discharge Rate 318 | 2C |
| Battery Cooling Type 320 | Liquid Cooled |
| Battery Charger Supply Power 322 | 85-264 VAC |
| Auxiliary Power 324 | 12VDC |
| Package Weight 326 | 1200 lb. (544 kg) |

302

350

| | |
|---|---|
| Motor Rated/Peak Power 354 | 10-250 kW |
| Motor Rated/Peak Torque 356 | 30-1200 Nm |
| Motor Rated Speed 358 | 1400-6000 RPM |
| Motor Cooling Type 360 | Liquid cooled and/or non-liquid cooled |
| Battery Energy 362 | 10-400K kWh |
| Battery Chemical Type 364 | LFP |
| Max Continues Charge/discharge Rate 366 | 1C |
| Max Pulse Charge/discharge Rate 368 | 2C |
| Battery Cooling Type 370 | Liquid cooled and/or non-liquid cooled |
| Battery Charger Connection 372 | EV charger J1772, Fast charging CCS |
| Auxiliary Power 374 | 12-24VDC |
| Package Weight 376 | 200-5000lb. (90-2270kg) |

ELECTRICAL PACKAGE

CROSS-REFERENCE TO RELATED APPLICATION

The present application is a continuation of International Application No. PCT/US2024/054302, filed Nov. 1, 2024, which claims priority to U.S. Provisional Application No. 63/547,334, filed Nov. 3, 2023, entitled "Electrical Package." The entire disclosure contents of these applications are herewith incorporated by reference into the present application.

BACKGROUND

Electricity may be used to power a variety of objects. The amount of electricity needed to power an object may depend on the type of object. For example, a laptop may need less electricity to be powered than an oven.

OVERVIEW

In a first embodiment, an electrical package comprises at least one battery, at least one electrical motor, a battery charger used to charge the at least one battery, a power converter, a cooling system, and a control system comprising at least one processor and a non-transitory computer readable medium.

In a second embodiment, a method comprises determining, by an at least one processor, whether to start a power converter of an electrical package, wherein the electrical package comprises at least one battery, at least one electrical motor, a battery charger used to charge the at least one battery, the power converter, a cooling system, and a control system comprising the at least one processor and a non-transitory computer readable medium, wherein the non-transitory computer readable medium has instructions stored thereon and determining, by the at least one processor, whether to start the cooling system of the electrical package.

BRIEF DESCRIPTION OF THE DRAWINGS

Example embodiments are described herein with reference to the drawings.

FIG. 3B depicts other data associated with the electrical package, in accordance with an example embodiment.

DETAILED DESCRIPTION

I. Electrical Package

Figure 1:
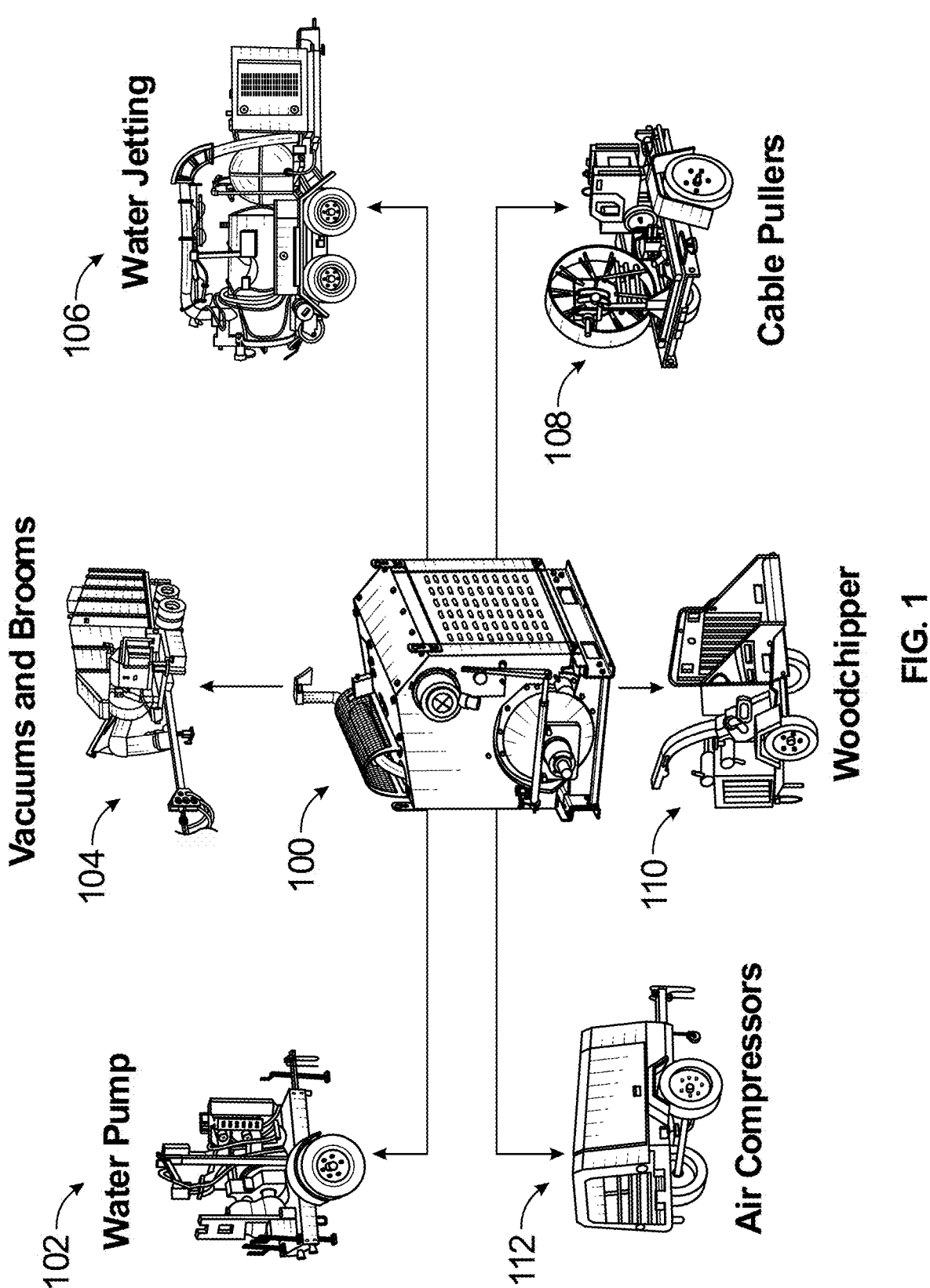
FIG. 1 depicts an electrical package, in accordance with an example embodiment.

FIG. 1 depicts an electrical package 100, in accordance with an example embodiment. In some examples, the electrical package 100 described herein may be used for a variety of applications. In particular, the electrical package 100 may be used to provide electrical energy to water pumps 102, vacuums and brooms 104, water jetting 106, cable pullers 108, wood chippers 110, and air compressors 112. The electrical package 100 may be referred to as a universal electrical package. Further, the electrical package 100 may be used to provide electrical energy to other external equipment, such as a stump grinder.

The electrical package 100 may be used in applications that have high electrical energy usage, and the electrical package 100 may include one or more components that facilitate such an application, as described below.

Figure 2:
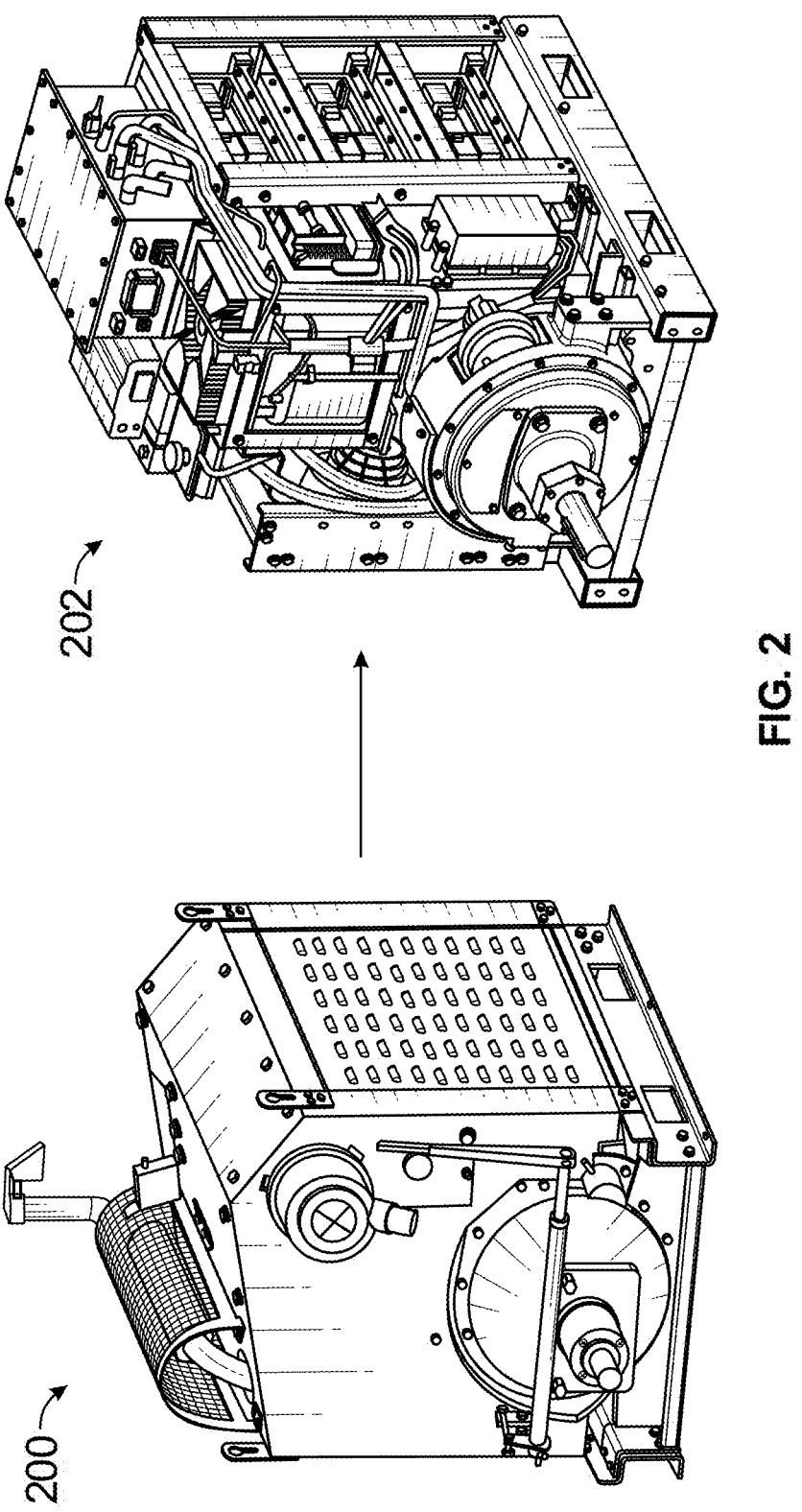
FIG. 2 depicts an electrical package and an exposed electrical package, in accordance with an example embodiment.

FIG. 2 depicts an electrical package 200 and an exposed electrical package 202, in accordance with an example embodiment. In particular, electrical package 200 may be an industrial grade electrical unit.

Electrical package 200 may serve as an enclosure for one or more components, as shown in exposed electrical package 202. In some examples, the components in electrical package 200 and exposed electrical package 202 may depend on the application of the electrical package.

Figure 3A:
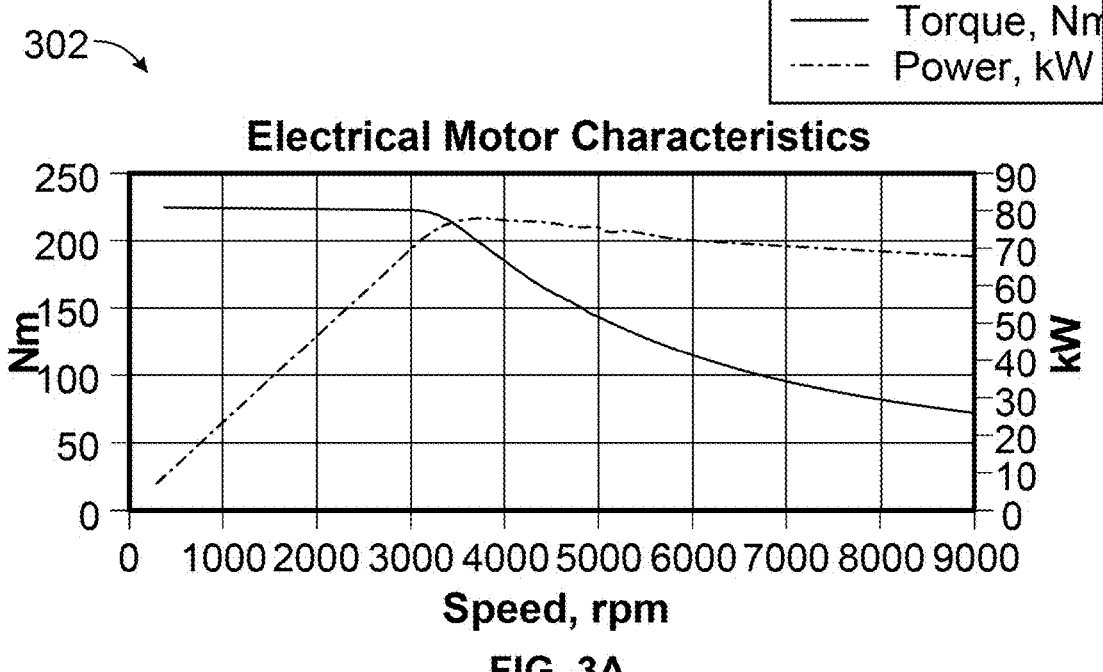
FIG. 3A depicts data associated with the electrical package, in accordance with an example embodiment.

FIG. 3A depicts data associated with the electrical package, in accordance with an example embodiment. As shown, data associated with the electrical package includes a table 300 and a chart 302. The electrical package may include batteries with an energy 312 of 30 kWh and a battery type 314 of LTC. The maximum continued charge and discharge rate 316 may be 1 C, and the maximum pulse charge and discharge rate 318 may be twice as much as the maximum continued charge and discharge rate (e.g., 2 C). In addition, the electrical package may include a cooler 320, which may be a liquid cooler. Having a liquid cooler may help cool the battery more effectively and more efficiently than having a non-liquid cooler (e.g., a fan), which may be particularly advantageous in high energy applications. In some examples, the electrical package may also include a battery charger, which may supply a power 322 of 85-264 VAC. The auxiliary power 324 may be 12 VDC, and the package weight 326 may be 1200 lbs. In addition, as shown in chart 302, the electrical package may include a motor with a power rating/peak power 304 of 30/60 kW. The motor may have torque rating/peak torque 306 of 100/200 Nm, and the motor may have a rated speed 308 of 3000 rpm. As shown in chart 302, torque of the motor may decrease with speed, while power of the motor may increase with speed. Further, in some embodiments, the motor may also include a motor cooling type 310, which may be a liquid cooler.

FIG. 3B depicts data associated with the electrical package, in accordance with an example embodiment. As shown, data associated with the electrical package includes a table 350. As shown in the table 350, the electrical package may include batteries with an energy 362 between 10 kWh and 400 kWh, and a battery chemical type 364 of LFP and a battery type of LTC and/or Blade Cell. The maximum continued charge and discharge rate 366 may be 1 C, and the maximum pulse charge and discharge rate 368 may be twice as much as the maximum continued charge and discharge rate (e.g., 2 C). In some embodiments, the electrical package may include a battery cooler having a battery cooling type 370, which may be a liquid cooler. Having a liquid cooler may help cool the battery more effectively and more efficiently than having a non-liquid cooler (e.g., a fan), which may be particularly advantageous in high energy applications. In other embodiments, the electrical package may include a non-liquid air cooler. Further, in some embodiments, the motor may also include a motor cooling type 360, which may include a liquid cooler and/or a non-liquid cooler. In some examples, the electrical package may also include a battery charger connection 372, which may be an EV charger J1772 or a fast charging CCS. The auxiliary power 374 may be 12-24 VDC, and the package weight 376 may be 200-5000 lbs. In addition, as shown in chart 350, the electrical package may include a motor with a power rating/peak power 354 of 10-250 kW. The motor may have torque rating/peak torque 356 of 30-1200 Nm, and the motor may have a rated speed 358 of 1400-6000 rpm.

In addition, the electrical package may include an inverter, which may be built into the electrical motor. The electrical package may also include a color thin-film-transistor liquid-crystal (TFT LCD) display along with a J1939 interface. In some examples, the components of the electrical package may be chosen to facilitate high energy usage applications. In particular, components of the electrical package may be chosen to withstand −30 to 140 degrees F. in operating temperature. The electrical package may have an EV charging rate from 3.3 kW to 14 kW and for DC fast charging up to 100 kW. Additionally and/or alternatively, the electrical package may also include a remote monitoring system. The electrical package may have low to no emissions, low maintenance cost, and less noise compared to others with engines.

Figure 4:
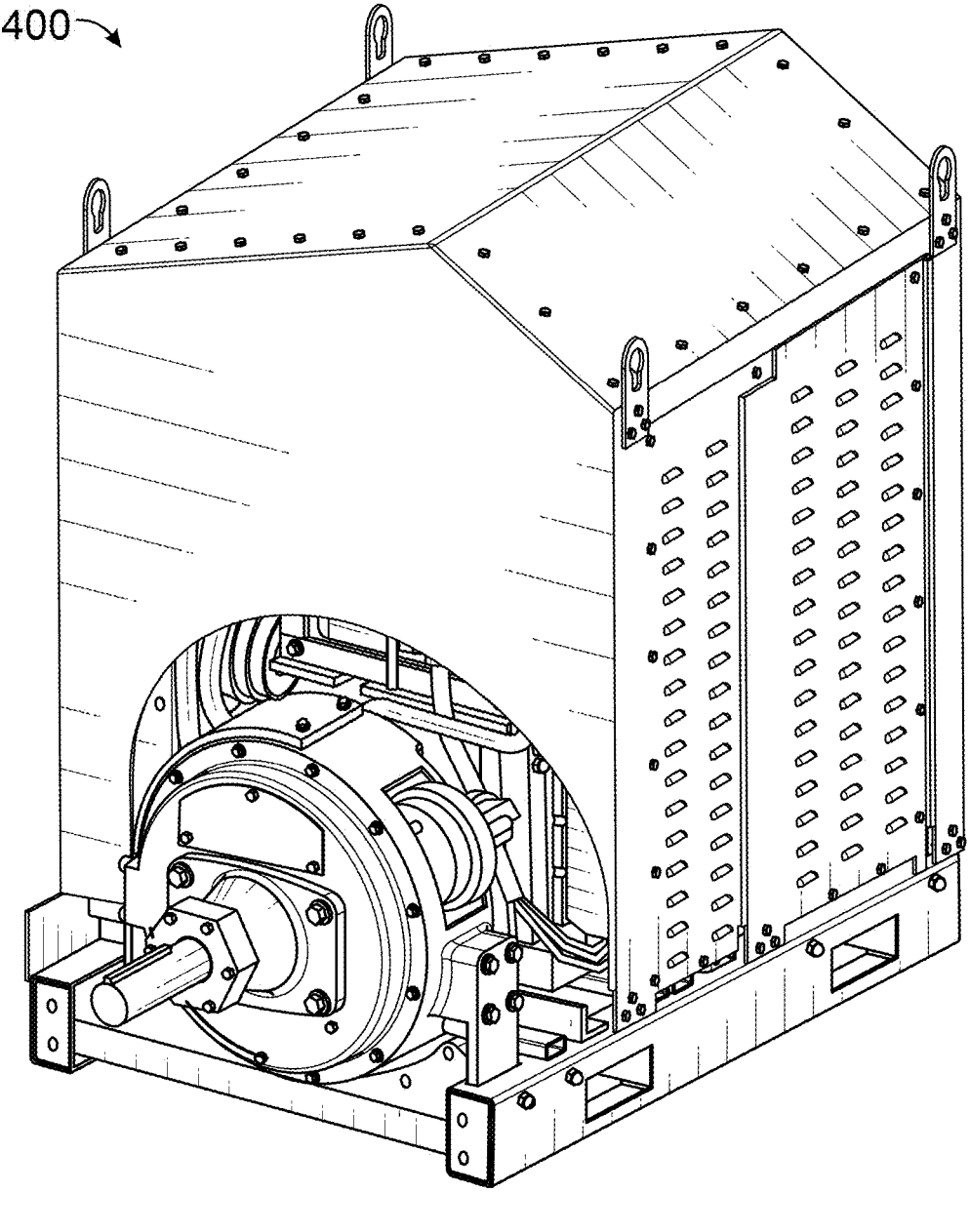
FIG. 4 depicts an enclosure for an electrical package, in accordance with an example embodiment.

FIG. 4 depicts an enclosure 400 for an electrical package, in accordance with an example embodiment. Enclosure 400 may be designed with battery structure and electrical motor mounting. In addition, a base of enclosure 400 may include forklift pockets. The forklift pockets may be configured to receive a portion of a forklift so as to lift and transport the enclosure 400. Additionally, enclosure 400 may have air intake and discharge ventilation, and may also be configured to connect the components within to an EV charging station using J1772. Further, enclosure 400 may include control display to control electrical motor and display electrical parameters from electrical equipment. Additionally, enclosure 400 may be designed with isolations to reduce vibration/shock on electrical equipment. Further, enclosure 400 may include service doors for electrical equipment access. In some embodiments, the enclosure 400 includes inner bracketry as well as outer panels for the electrical package.

The outer panels may then integrate seamlessly with the mounting bracketry for each of the individual components of the electrical package (e.g., batteries, radiator, motor, PDU, and a charger). Further, in some embodiments, the enclosure 400 may include a skid or a base for the electrical package.

Enclosure 400 may enclose exposed electrical package 202 of FIG. 2 and may include one or more components not shown in FIG. 4, including, for example, a controller display and a J1772 power socket. In some embodiments, in addition to the J1772 connector for EV charging, the electrical package may also include a CCS connection for DC charging.

Figure 5A:
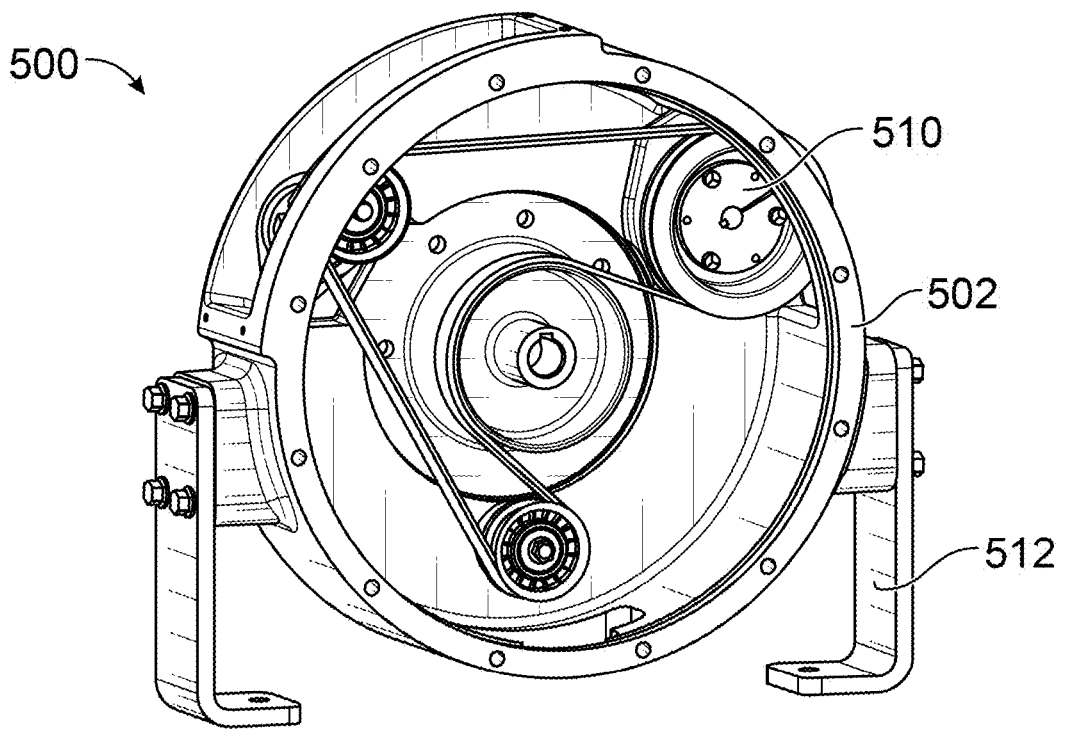
FIGS. 5A-5D depict perspective views of a backend of the electrical package, in accordance with an example embodiment.

FIG. 5A depicts a backend 500 to mount to the electrical package, in accordance with an example embodiment. In some embodiments, the backend may have a housing 502, the housing 502 configured to couple to the electrical motor 504 of the electrical package and an output including an output shaft mount 506 and an output shaft 508. The housing may include a pulley 510, the pulley including a belt and a plurality of wheels, including a tensioner wheel. The housing may further include mounting pads and brackets 512 configured to mount the housing on a frame of the electrical package.

Figure 5B:
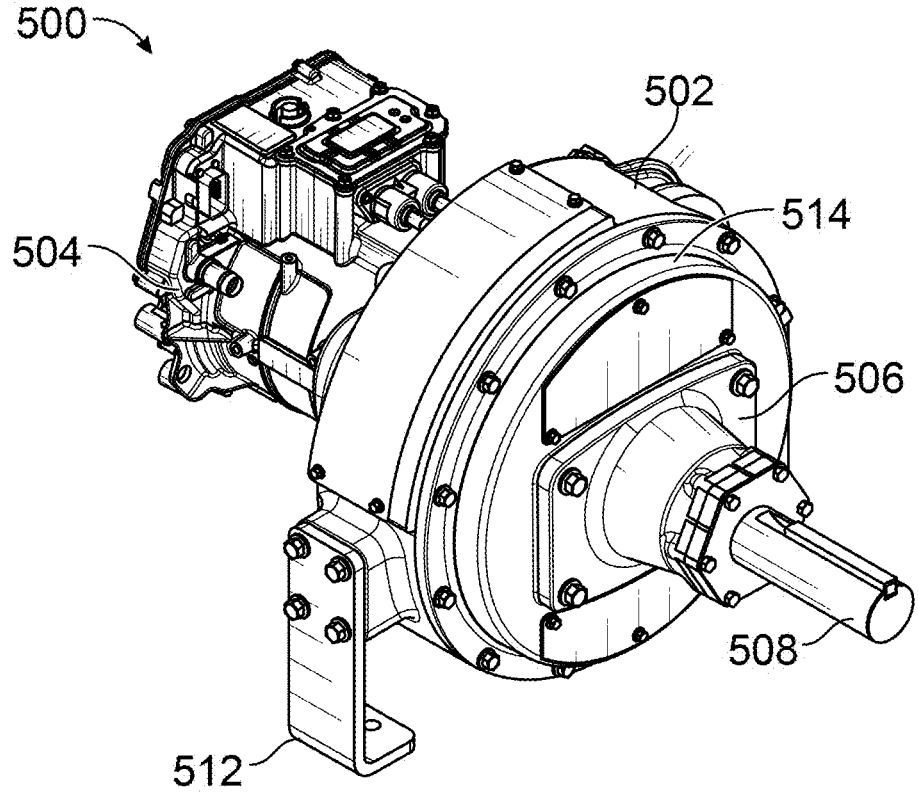

FIG. 5B depicts the backend 500 coupled to the electrical motor 504 and the output shaft 508. In some examples, the output shaft 508 is configured to couple to external equipment, such as a water pump, a vacuum, a water jet, an air compressor, a wood chipper, or a cable puller. The housing may further include a removable housing cover 514 configured to cover the pulley and couple to the output shaft mount 506. In some examples, the electrical motor 504 is configured to couple to the output by a hand press-fit key.

Figure 5C:
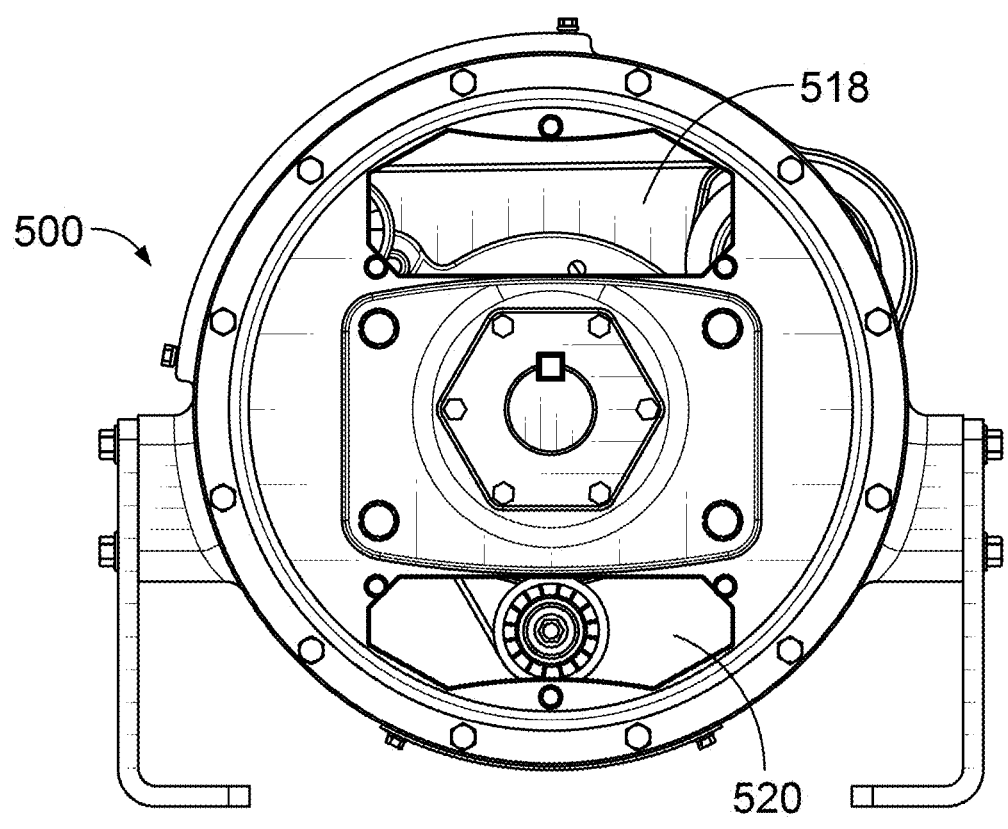
Figure 5D:
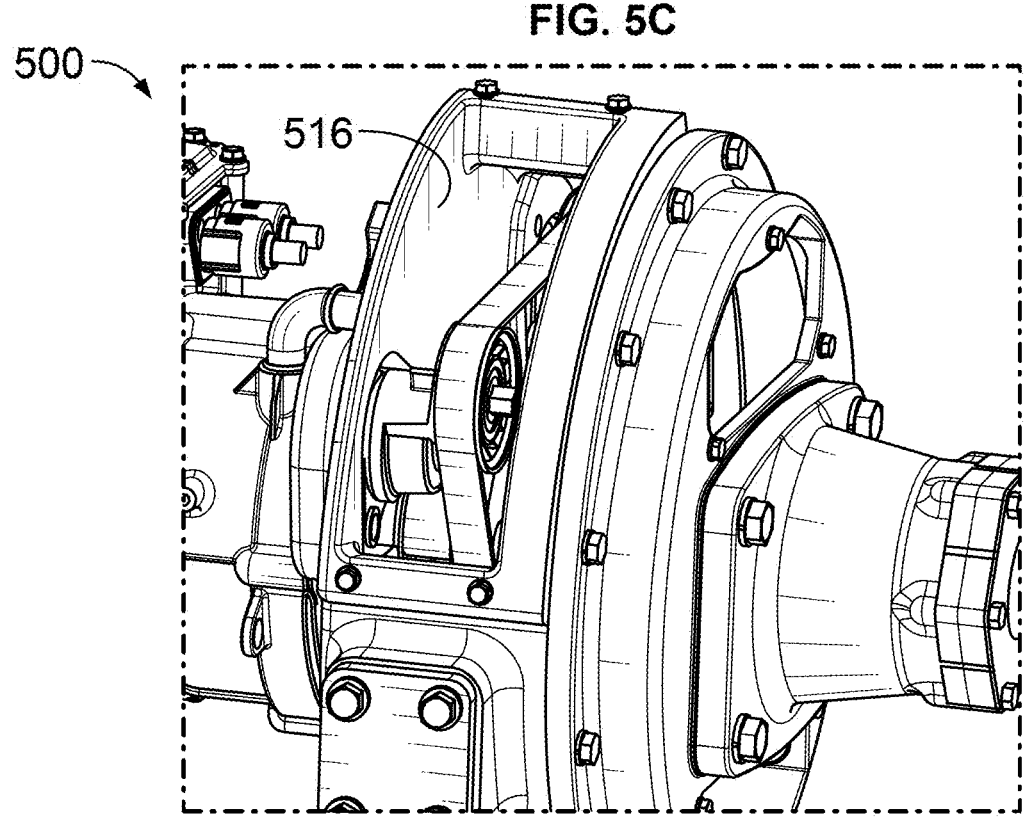

FIGS. 5C and 5D depict a plurality of cutouts in the housing of the backend 500, according to an example embodiment. One of the cutouts 516 may be positioned to allow access to the belt of the pulley. Another of the cutouts 518 may be positioned to allow access to one of the wheels of the pulley. A further cutout 520 may be positioned to allow access to the tensioner wheel of the pulley. In some examples, the backend may include removable cutout covers to cover the cutouts during operation of the electrical package.

Figure 6A:
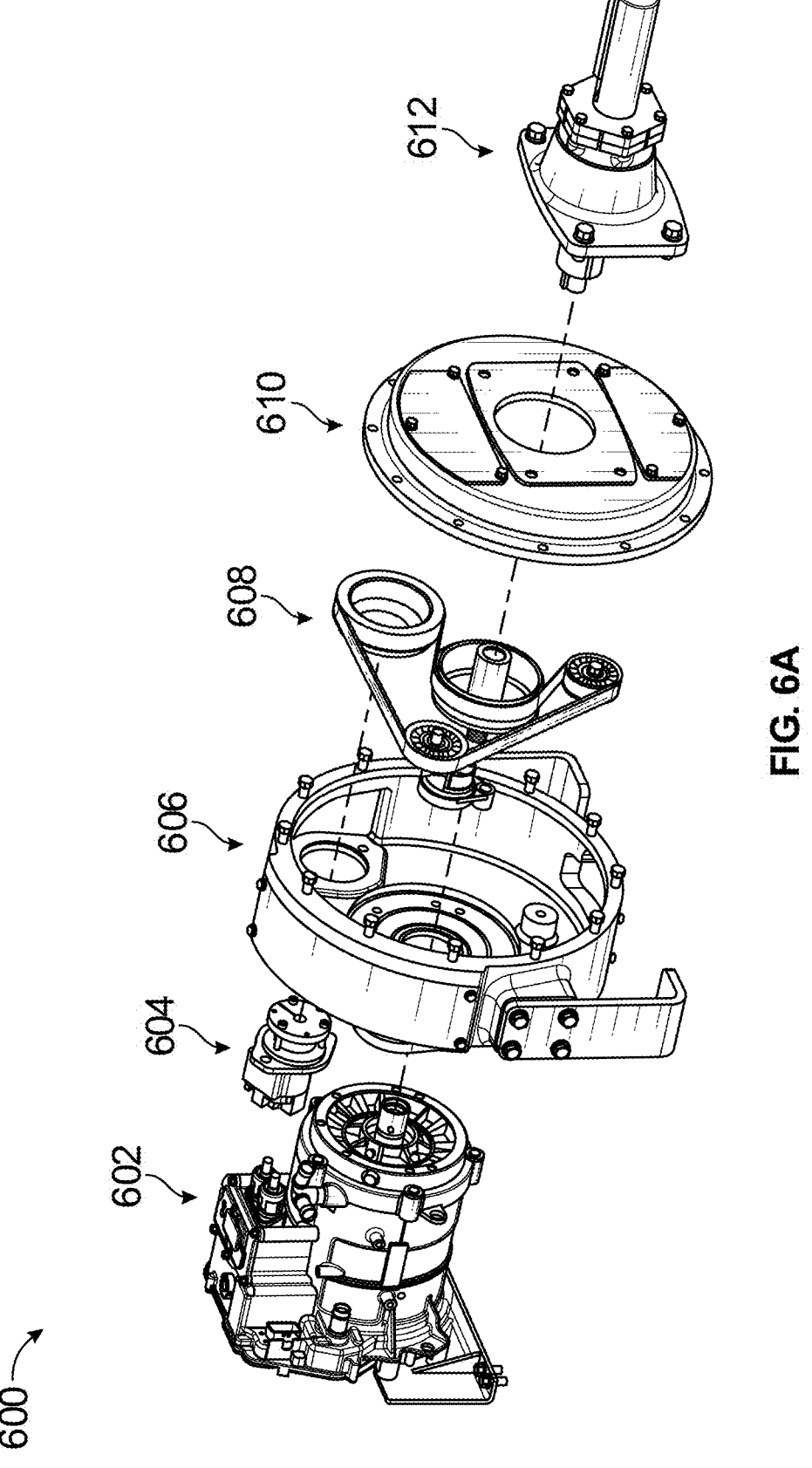
FIG. 6A depicts an exploded perspective view of a mechanical output of the electrical package, in accordance with an example embodiment.

FIG. 6A depicts an exploded view of a mechanical output 600, according to an example embodiment. In some examples, the mechanical output 600 includes the electrical motor 602, a hydraulic pump 604, the backend 606, the pulley 608, the removable housing cover 610, and the output 612.

Figure 6B:
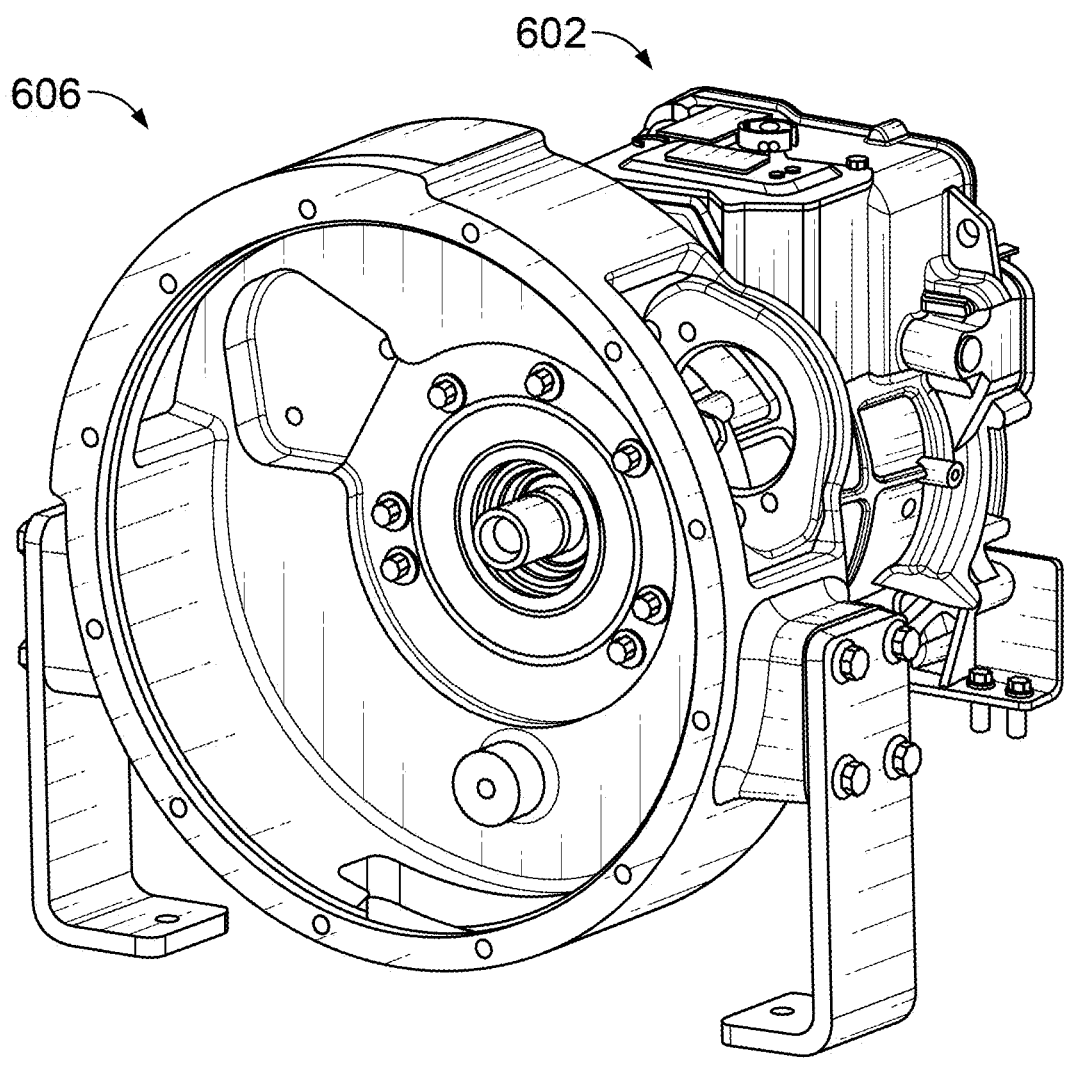
FIGS. 6B-6D depict perspective views of components of the mechanical output, in accordance with an example embodiment.

FIG. 6B depicts a perspective view of the electrical motor coupled 602 to the backend 606, according to an example embodiment.

Figure 6C:
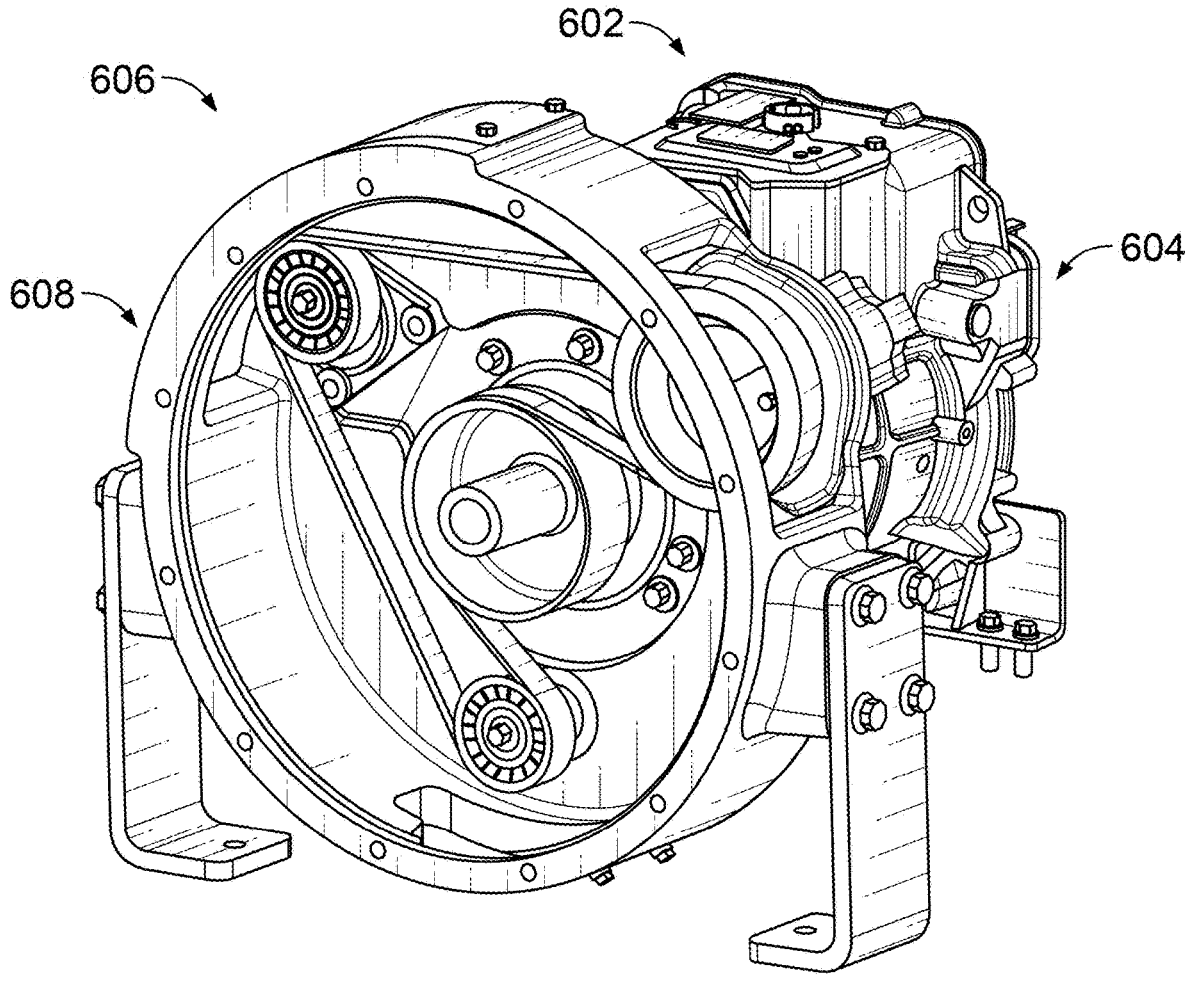

FIG. 6C depicts a perspective view of the pulley 608 and the hydraulic pump 604 coupled to the backend 606, according to an example embodiment. In some examples, the pulley 608 is configured to mechanically power the hydraulic pump 604. In some examples, the hydraulic pump 604 is coupled to a cooler configured to water-cool the electrical package during operation of the electrical motor. In some examples, the pulley belt is a double-sided belt. In further examples, the pulley belt is a ribbed belt. In further examples, the pulley belt may be a flat side pulley belt.

Figure 6D:
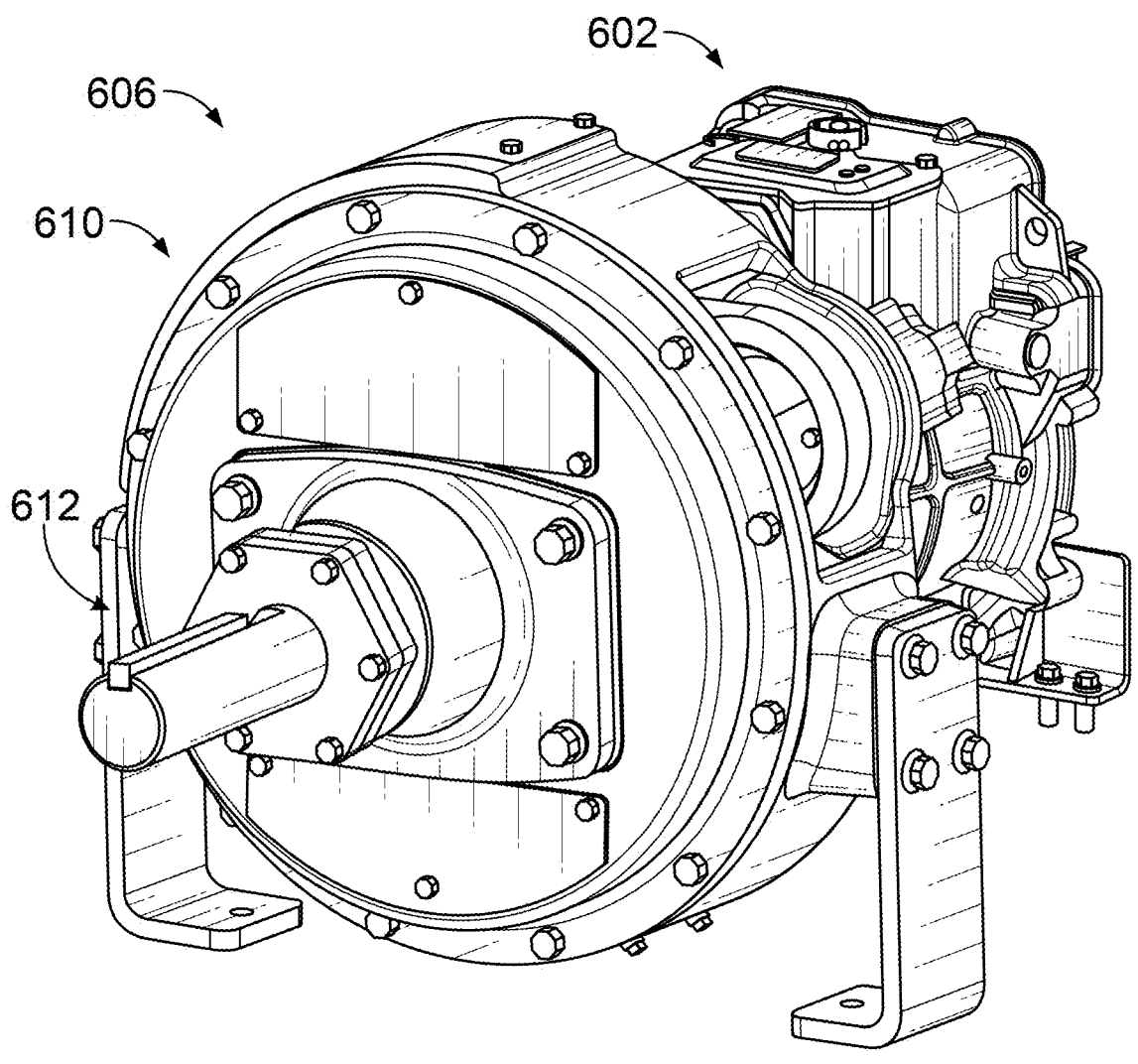

FIG. 6D depicts a perspective view of the removable housing cover 610 and the output 612 coupled to the backend 606 with the removable cutout covers installed, according to an example embodiment.

In some embodiments described above, power take-off (PTO) is a feature that is included in the electrical package that delivers torque from the motor to an auxiliary system component by using the rotation of the shaft to rotate a shaft of a component of the auxiliary system. In the embodiments above, the design of the electrical package transfers mechanical energy from the motor to the external piece of equipment that the motor is running.

Further, in some embodiments, the electrical package may include a "clutched" mechanism that allows the output shaft of the external equipment (e.g., a woodchipper drum) to be disconnected from the rotating input shaft (e.g., the motor of the electrical package). In other embodiments, the electrical package may include one or more mechanical adapters to drive hydraulic or water pumps that may be necessary for the external piece of equipment that the motor is running.

Figure 7:
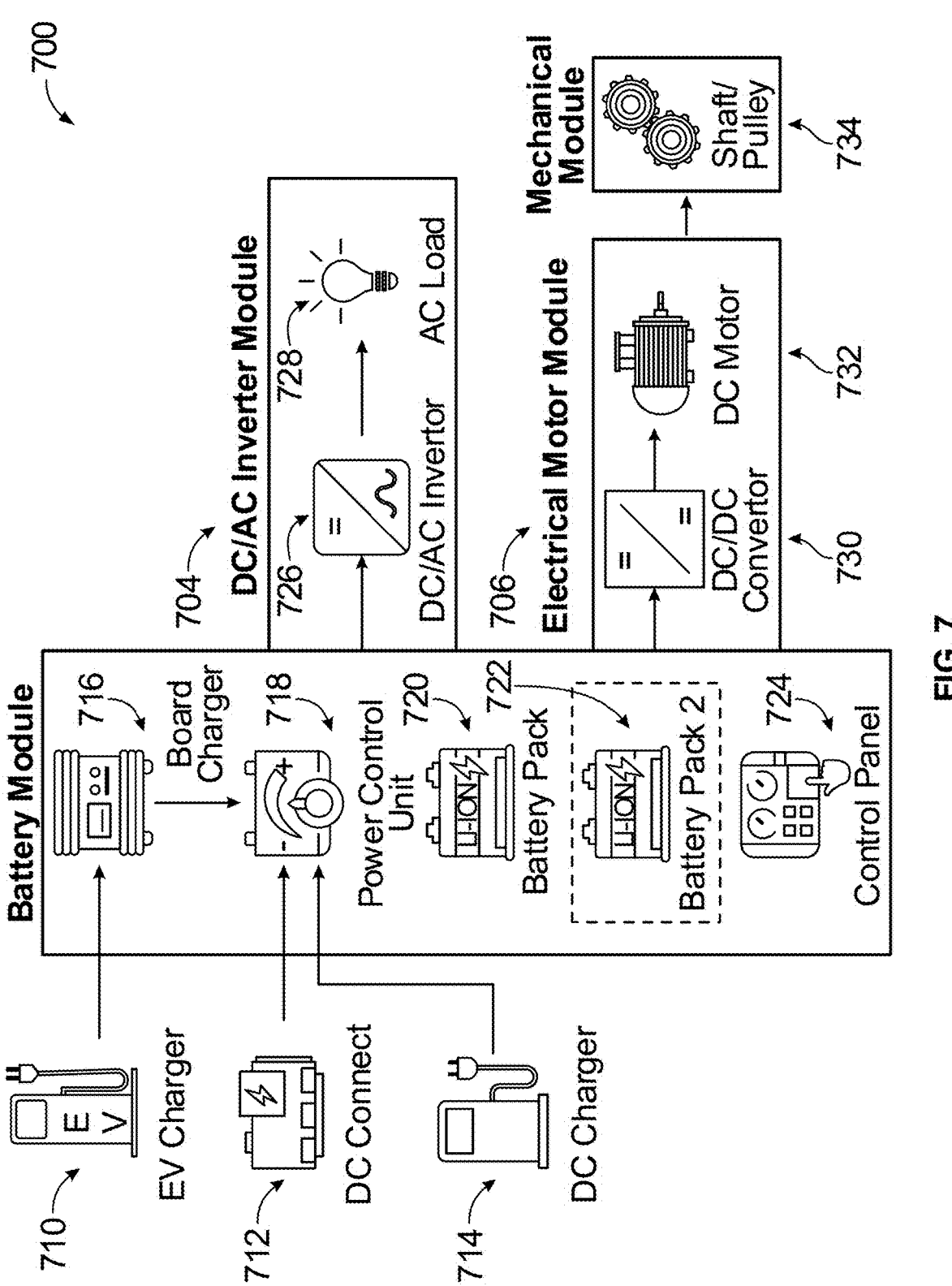
FIG. 7 depicts a modular design for an electrical package, in accordance with an example embodiment.

FIG. 7 depicts a modular design for an electrical package 700, in accordance with an example embodiment. In some examples, the electrical package may have a modular design, including a battery module 702, a DC/AC inverter module 704, an electrical motor module 706, and a mechanical module 708. The battery module 702 may include a battery package 720, a controller display 724 with optional on-board battery charger 716 and an optional DC/AC inverter for lower energy level charging (e.g., charging laptops). The battery module 702 may be charged by an EV charger 710, a DC fast battery charger 712, and/or a DC engine driven generator 714. Additionally, the battery module 702 may be expanded by one or more additional battery packs 722 to increase storage capacity. The battery module 702 may have an output of a DC/AC inverter for a VAC load and/or a DC/DC inverter for a VDC load. The battery module 702 may also include a power control unit 718.

In some embodiments, the DC/AC inverter module 704 includes a DC/AC Invertor 726 and an AC load 728. Further, in some embodiments, the electrical motor module 706 includes a DC/DC Convertor 730 and a DC Motor 732. In some embodiments, the mechanical module 708 includes a shaft/pulley 734.

Figure 8:
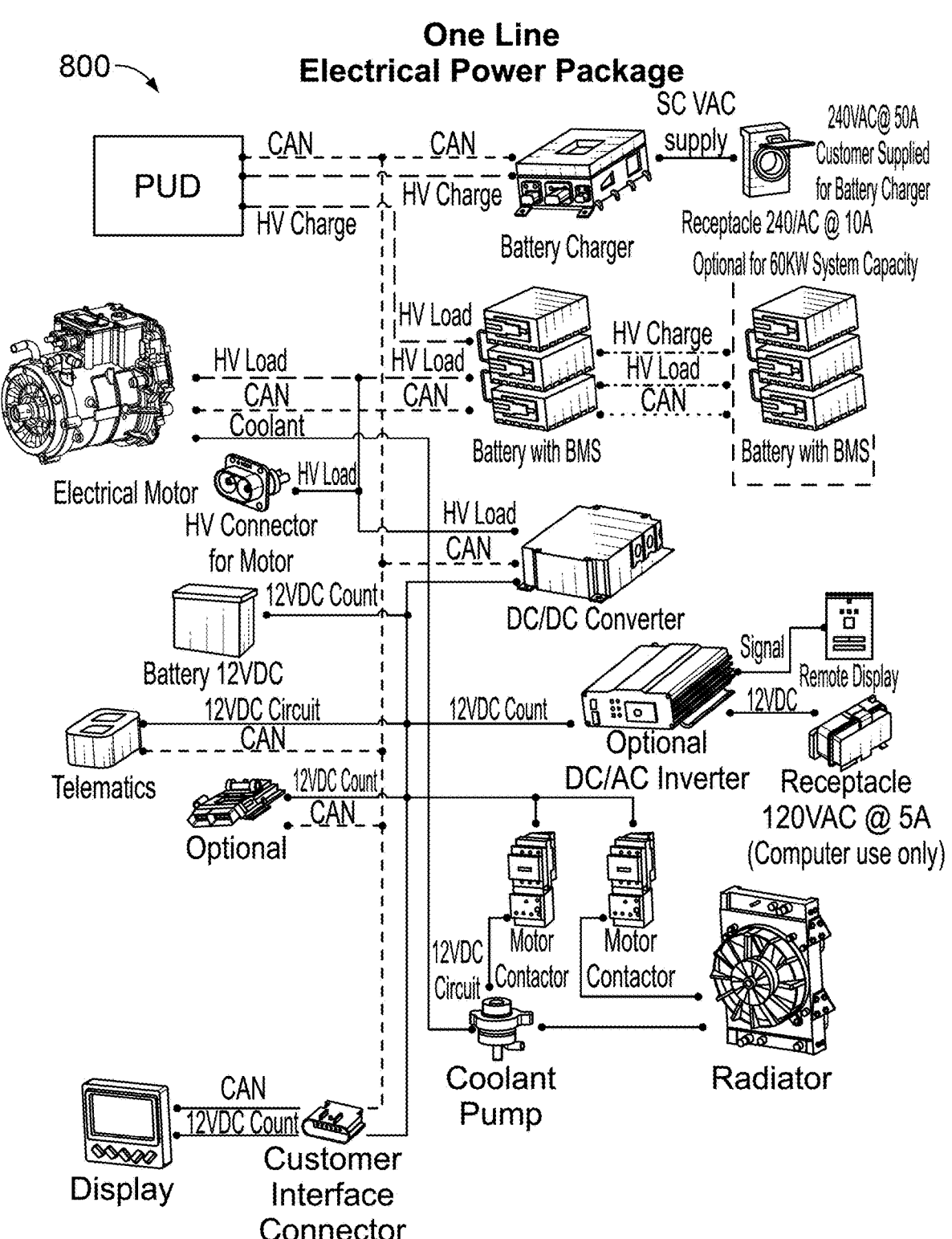
FIG. 8 depicts components for an electrical package, in accordance with an example embodiment.

FIG. 8 depicts components for an electrical package 800, in accordance with an example embodiment. Components for the electrical package may include a battery with PUD, an electrical motor with an inverter, an on board battery charger, a DC/DC inverter for a 12V control circuit, a radiator with a coolant pump, a telematics system, a control unit to control MCU wakeup, DC/DC wakeup, fan/pump control, among other components that could be related to internal power pack package. The electrical package may also include one or more controllers to control the power package and display major parameters and alarms, and perhaps to execute a one or more processes described herein. In some embodiments, the on board battery charger has an integrated DC/DC inverter for a 12V control circuit.

Figure 9:
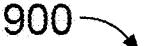
FIG. 9 depicts an electrical package, in accordance with an example embodiment.

FIG. 9 depicts an electrical package 900, in accordance with an example embodiment. The electrical package 900 shown in FIG. 9 may be an exposed electrical package (e.g., similar to exposed electrical package 202 of FIG. 2), and may be covered by an enclosure, such as enclosure 400 of FIG. 4.

The electrical package 900 may be a complete heavy-duty lithium-ion battery solution for specific applications. The power unit may be a EPA-certified package and may be designed for reliability, durability, and safety. The electrical package 900 may be equipped to handle substantially similar applications as a 3.0 L displacement engine. The electrical package 900 may include a mechanical connection (e.g., a shaft/key sized for pulley connection).

Among other features, the electrical package 900 may be water-cooled and have an electrical charger for sustainable low temperatures at maximum power output. Additionally, the electrical package 900 may include a brushless, waterproof, high-output fan for efficient air cooling with minimal packaging disruption. The fan may have a low profile, which may facilitate efficient air cooling with minimal package disruption. Further, the electrical package 900 may have low operating noise output, which may allow for extended work hours in residential areas without community disruption (which may also be facilitated by liquid cooling rather than mechanical cooling). Further, the battery powered motor may allow for simpler maintenance and lower maintenance costs in contrast with an engine.

Figure 10A:
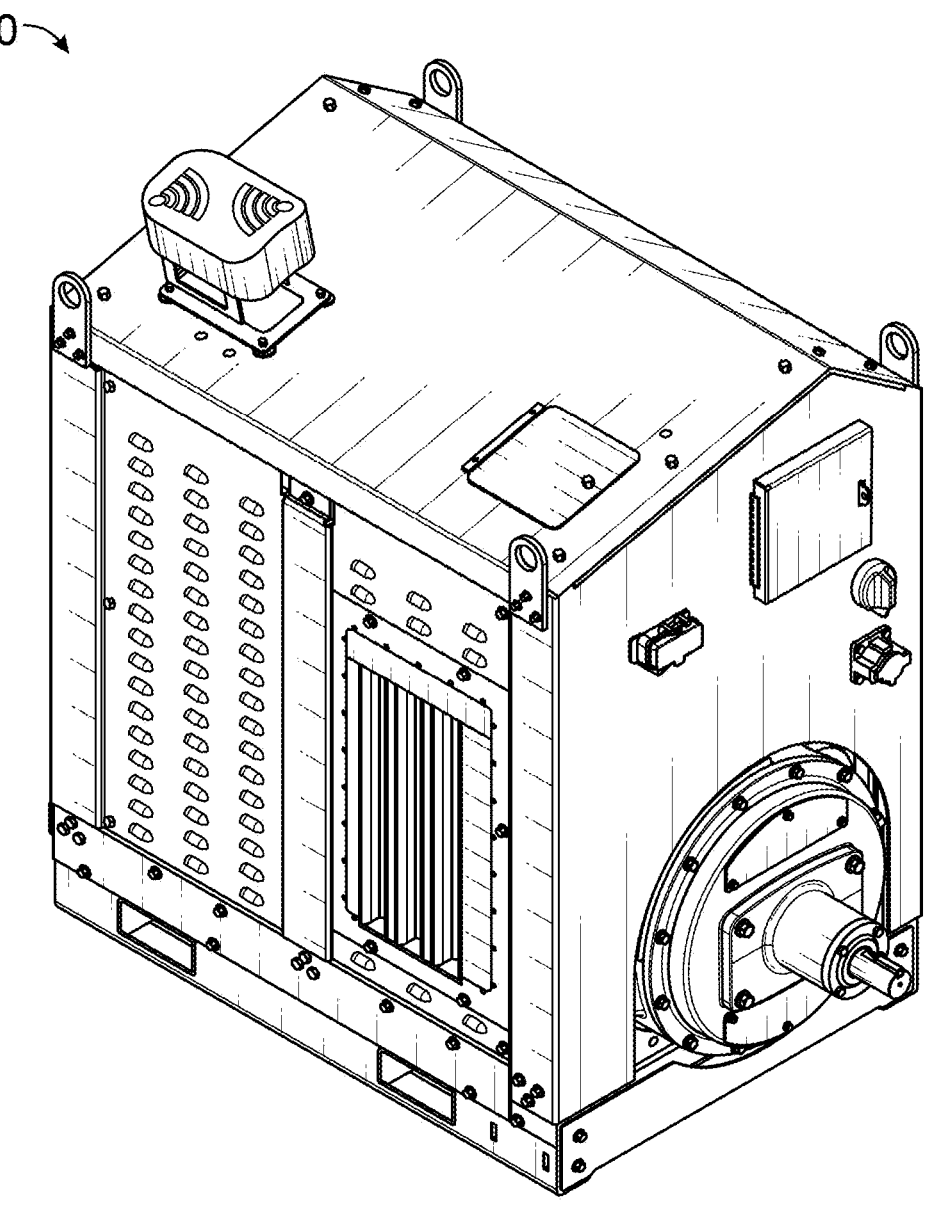
FIG. 10A depicts an electrical package, in accordance with an example embodiment.
Figure 10B:
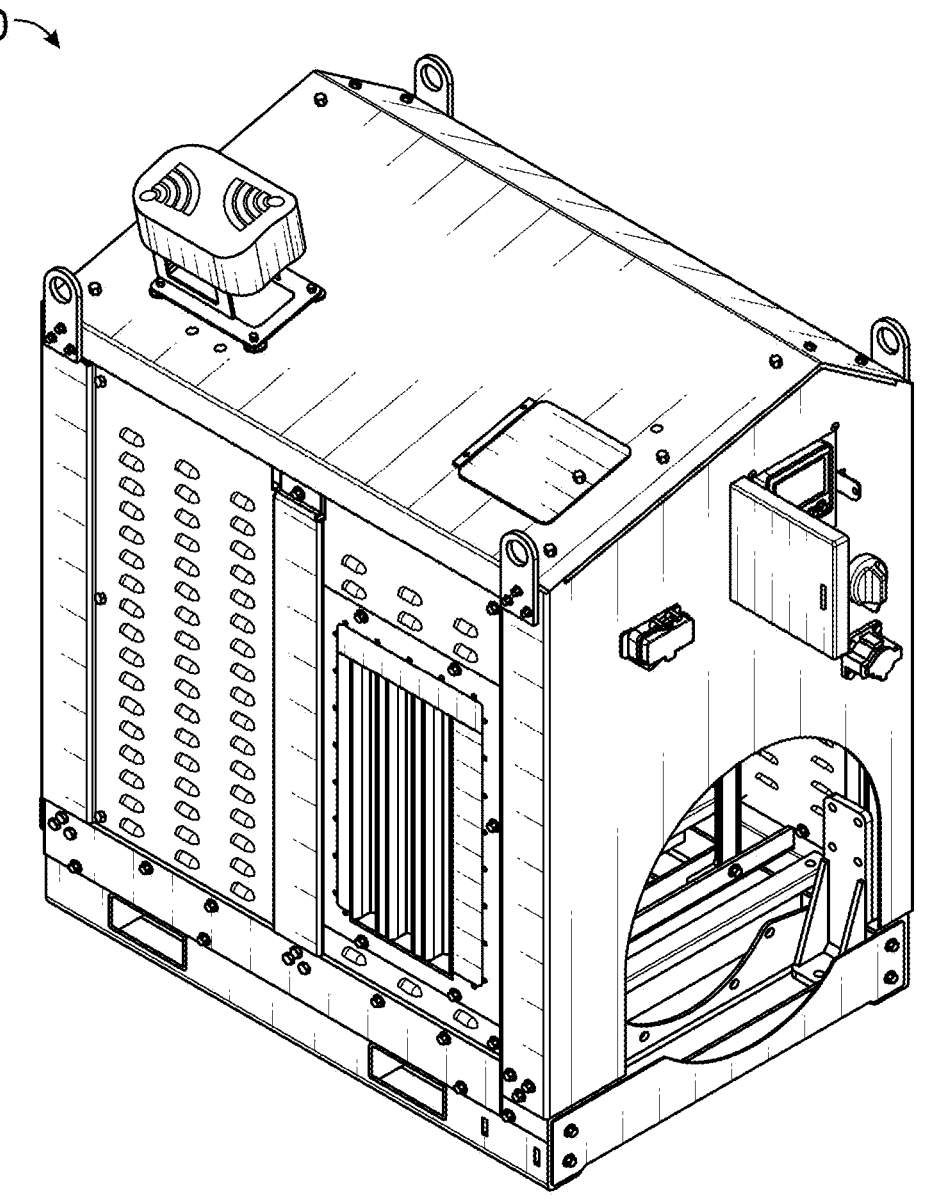
FIG. 10B depicts an enclosure for the electrical package in FIG. 10A, in accordance with an example embodiment.

FIG. 10A depicts an electrical package 1000, in accordance with an example embodiment, and FIG. 10B depicts an enclosure for the electrical package 1000 in FIG. 10A, in accordance with an example embodiment. The electrical package 1000 shown in FIGS. 10A-10B may include an exposed electrical package (e.g., similar to exposed electrical package 202 of FIG. 2 and exposed electrical package 900 of FIG. 9), and may be covered by an enclosure, such as enclosure 400 of FIG. 4, as shown in FIG. 10B. The electrical package 1000 may include any components of an electrical package as described above.

Figure 11A:
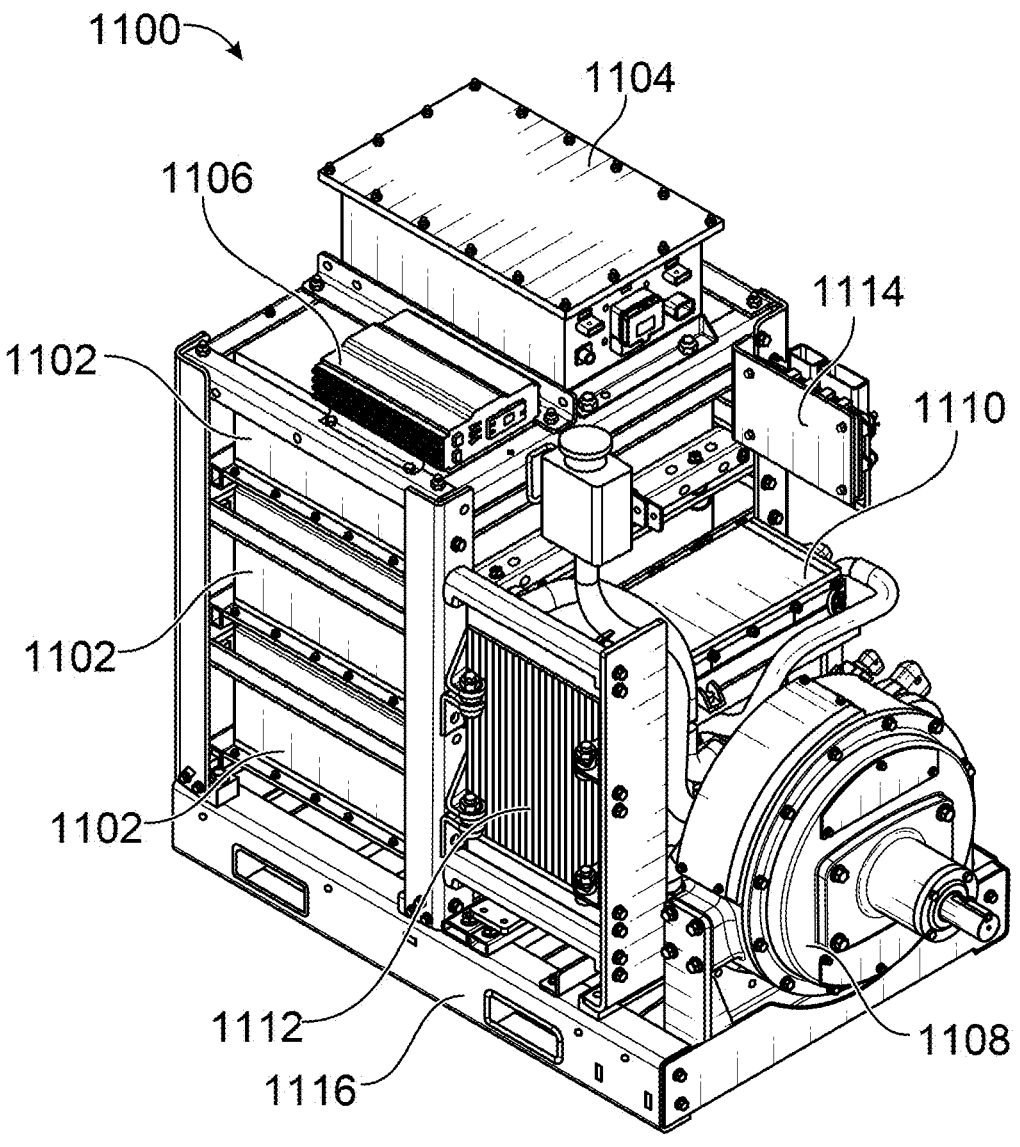
FIG. 11A depicts an exposed electrical package, in accordance with an example embodiment.
Figure 11B:
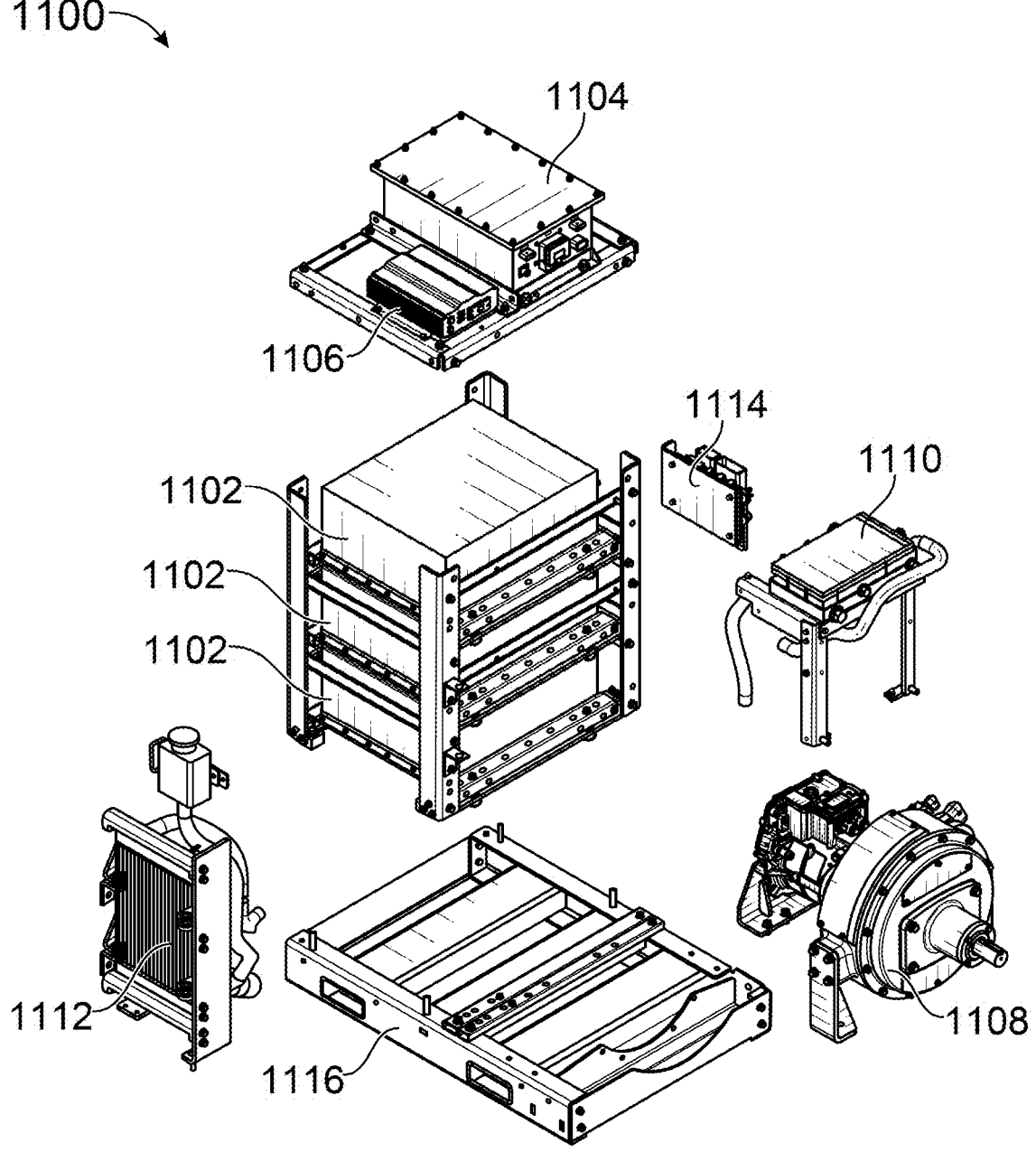
FIG. 11B depicts an exploded view of the exposed electrical package of FIG. 11A, in accordance with an example embodiment.

FIG. 11A depicts an exposed electrical package 1100, in accordance with an example embodiment and FIG. 11B depicts an exploded view of the exposed electrical package 1100 of FIG. 11A, in accordance with an example embodiment. The electrical package 1100 may include any components of an electrical package as described above. For instance, as shown in FIGS. 11A-11B, the electrical package 1100 may include a battery pack set 1102, a power distribution unit (PDU) 1104, a DC/AC Inverter 1106, a motor and power take-off (PTO) 1108, a water or air-cooled battery charger 1110, a radiator and water pump 1112, a controller 1114, and a base, skid, or other mechanical means of integrating parts together in a drop-in package 1116. In some embodiments, the above components may be combined and assembled in order to form the electrical package 1100 as shown in FIG. 11A.

Figure 12:
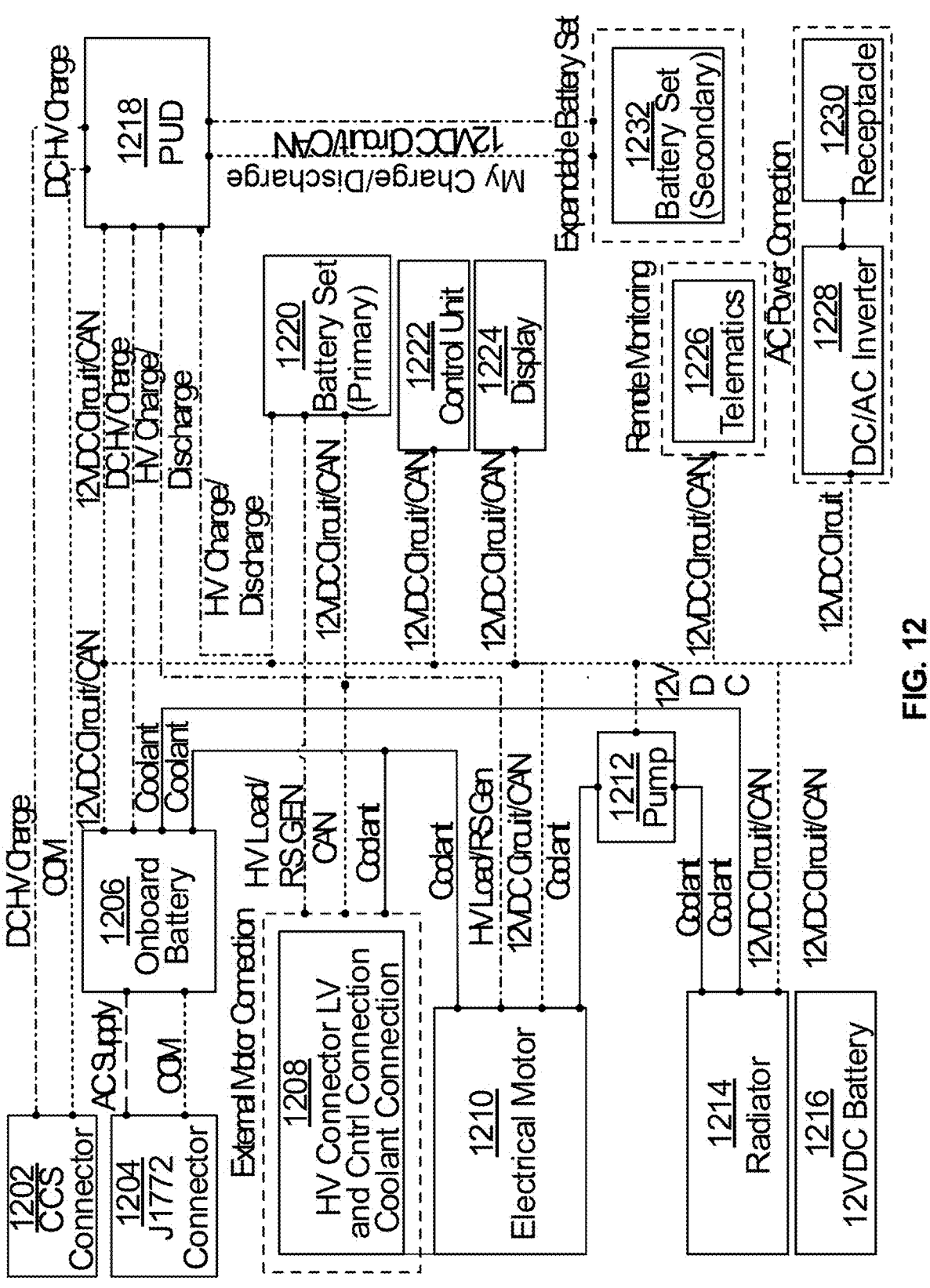
FIG. 12 depicts components for an electrical package, in accordance with an example embodiment.

FIG. 12 depicts components for an electrical package, in accordance with an example embodiment. The electrical power package 1200 can include any component described above. For example, as shown in FIG. 12, the electrical power package 1200 may include a CCS connector 1202, a J1772 connector 1204, an on board battery charger 1206, an HV connector LV and control connector coolant connection 1208, an electrical motor 1210, a pump 1212, a radiator 1214, a 12 VDC battery 1216, a PUD 1218, a battery set (primary) 1220, a control unit 1222, a display 1224, telematics 1226, a DC/AC inverter 1228 and receptacle 1230, and a battery set (secondary) 1232. In other embodiments, the electrical power package 1220 may not include the components in FIG. 12 that may be optional, such as the HV connector LV and control connector coolant connection 1208, the telematics 1226, the DC/AC inverter 1228 and receptacle 1230, and the battery set (secondary) 1232. Further, connections 1234 may exist between two or more components in the electrical power package 1200.

Figure 13:
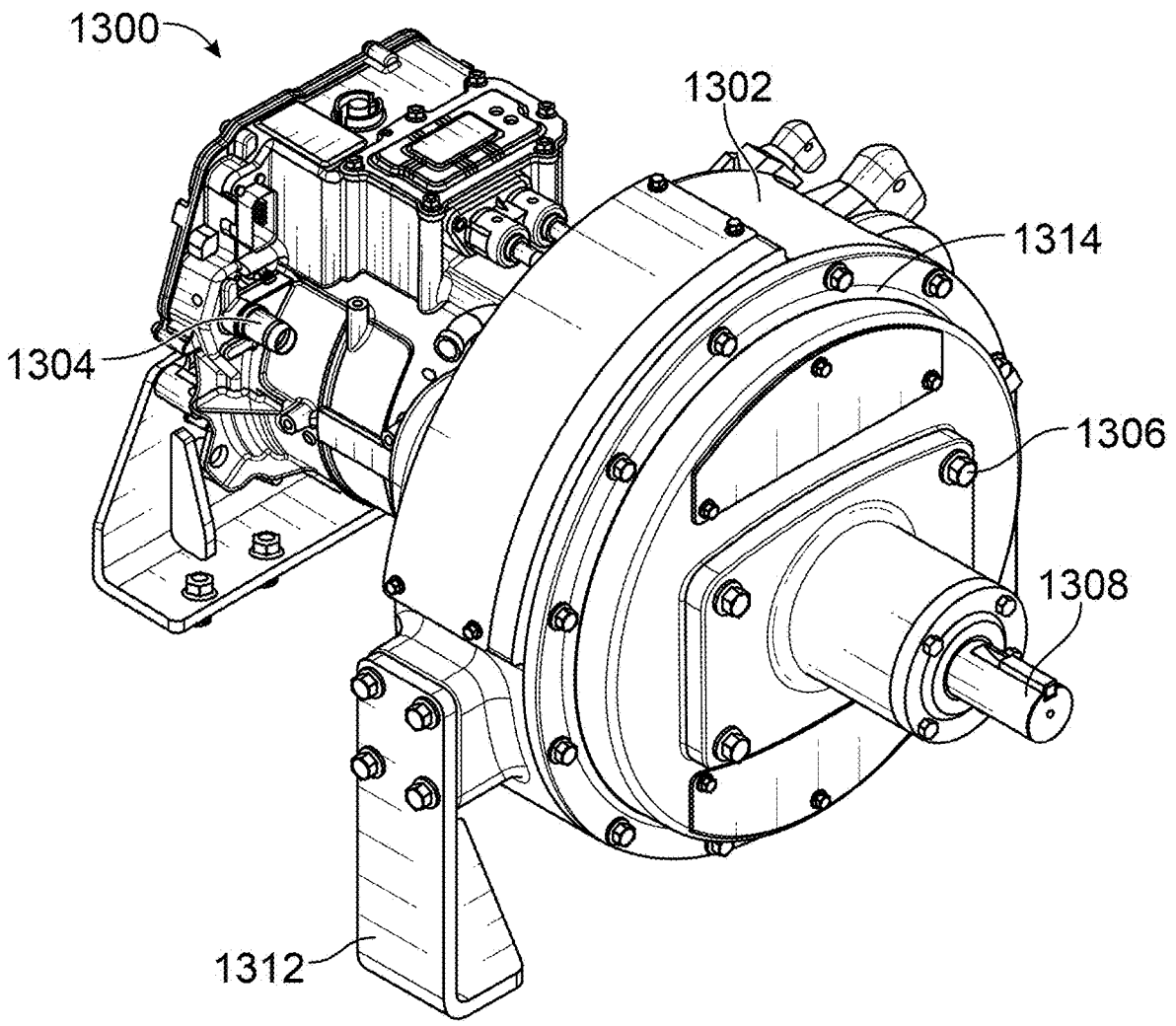
FIG. 13 depicts a perspective view of another backend of the electrical package, in accordance with an example embodiment.

FIG. 13 depicts a backend 1300 coupled to an electrical motor 1304 and the output shaft 1308. In some examples, the output shaft 1308 is configured to couple to external equipment. The housing may further include a removable housing cover 1314 configured to cover the pulley and couple to the output shaft mount 1306. In some examples, the electrical motor 1304 is configured to couple to the output by a hand press-fit key. The housing may further include mounting pads and brackets 1312 configured to mount the housing on a frame of the electrical package. The mounting pads and brackets 1312 are different than the mounting pads and brackets.

In a first embodiment, an electrical package comprises at least one battery, at least one electrical motor, a battery charger used to charge the at least one battery, a power converter, a cooling system, and a control system comprising at least one processor and a non-transitory computer readable medium.

In a second embodiment, a method comprises determining, by an at least one processor, whether to start a power converter of an electrical package, wherein the electrical package comprises at least one battery, at least one electrical motor, a battery charger used to charge the at least one battery, the power converter, a cooling system, and a control system comprising the at least one processor and a non-transitory computer readable medium, wherein the non-transitory computer readable medium has instructions stored thereon and determining, by the at least one processor, whether to start the cooling system of the electrical package.

II. Conclusion

It should be understood that the arrangements described herein and/or shown in the drawings are for purposes of example only and are not intended to be limiting. As such, those skilled in the art will appreciate that other arrangements and elements (e.g., machines, interfaces, functions, orders, and/or groupings of functions) can be used instead, and some elements can be omitted altogether.

While various aspects and embodiments are described herein, other aspects and embodiments will be apparent to those skilled in the art. The various aspects and embodiments disclosed herein are for purposes of illustration and are not intended to be limiting, with the true scope being indicated by the claims, along with the full scope of equivalents to which such claims are entitled. It is also to be understood that the terminology used herein for the purpose of describing embodiments only, and is not intended to be limiting.

In this description, the articles "a," "an," and "the" are used to introduce elements and/or functions of the example embodiments. The intent of using those articles is that there is one or more of the introduced elements and/or functions.

In this description, the intent of using the term "and/or" within a list of at least two elements or functions and the intent of using the terms "at least one of," "at least one of the following," "one or more of," "one or more from among," and "one or more of the following" immediately preceding a list of at least two components or functions is to cover each embodiment including a listed component or function independently and each embodiment including a combination of the listed components or functions. For example, an embodiment described as including A, B, and/or C, or at least one of A, B, and C, or at least one of: A, B, and C, or at least one of A, B, or C, or at least one of: A, B, or C, or one or more of A, B, and C, or one or more of: A, B, and C, or one or more of A, B, or C, or one or more of: A, B, or C is intended to cover each of the following possible embodiments: (i) an embodiment including A, but not B and not C, (ii) an embodiment including B, but not A and not C, (iii) an embodiment including C, but not A and not B, (iv) an embodiment including A and B, but not C, (v) an embodiment including A and C, but not B, (v) an embodiment including B and C, but not A, and/or (vi) an embodiment including A, B, and C. For the embodiments including component or function A, the embodiments can include one A or multiple A. For the embodiments including component or function B, the embodiments can include one B or multiple B. For the embodiments including component or function C, the embodiments can include one C or multiple C. In accordance with the aforementioned example and at least some of the example embodiments, "A" can represent a component, "B" can represent a system, and "C" can represent a symptom.

The use of ordinal numbers such as "first," "second," "third" and so on is to distinguish respective elements rather than to denote an order of those elements unless the context of using those terms explicitly indicates otherwise. Further, the description of a "first" element, such as a first plate, does not necessitate the presence of a second or any other element, such as a second plate.

What is claimed is:

1. An electrical package comprising:
   at least one battery;
   at least one electrical motor;
   a battery charger used to charge the at least one battery;
   a power converter;
   a cooling system;
   a backend coupled to the at least one electrical motor, the backend comprising:
      a backend housing, wherein the backend housing comprises a backend housing cover, and
      a pulley within the backend housing, wherein the backend housing cover is configured to cover the pulley;
   a mechanical output extending through the backend housing cover; and
   a control system comprising at least one processor and a non-transitory computer readable medium.

2. The electrical package of claim 1, wherein the non-transitory computer readable medium has instructions stored thereon that, when executed by the processor, cause the processor to perform one or more operations.

3. The electrical package of claim 2, wherein the cooling system comprises a radiator.

4. The electrical package of claim 3, wherein the radiator includes a coolant pump.

5. The electrical package of claim 4, wherein the one or more operations comprise:
   determine whether to start the power converter; and
   determine whether to start the coolant pump.

6. The electrical package of claim 2, wherein the cooling system comprises a fan.

7. The electrical package of claim 1, further comprising:
   a telematics system.

8. The electrical package of claim 1, further comprising:
   an invertor, wherein the invertor is built into the at least one electrical motor.

9. The electrical package of claim 1, further comprising:
   a color thin-film-transistor liquid-crystal (TFT LCD) display.

10. The electrical package of claim 1, further comprising:
    a remote monitoring system.

11. The electrical package of claim 1, further comprising:
    an enclosure, wherein the enclosure includes a battery mounting portion configured to mount the at least one battery and an electrical motor mounting portion configured to mount the at least one electrical motor.

12. The electrical package of claim 11, wherein the enclosure comprises a base, wherein the base includes one or more pockets, and wherein the one or more pockets are configured to receive a portion of a forklift.

13. The electrical package of claim 11, wherein the enclosure comprises one or more ventilation areas, and wherein the battery mounting portion of the enclosure excludes the one or more ventilation areas.

14. The electrical package of claim 11, wherein the enclosure comprises one or more shock mitigators.

15. The electrical package of claim 11, wherein the enclosure comprises one or more service doors by which the at least one battery is accessed.

16. The electrical package of claim 1, wherein the pulley is coupled to a hydraulic pump.

17. The electrical package of claim 1, wherein the mechanical output is configured to couple to external equipment.

18. The electrical package of claim 17, wherein the external equipment comprises at least one of: a water pump, a vacuum, a water jet, an air compressor, a wood chipper, a cable puller, and a stump grinder.

19. The electrical package of claim 1, wherein the backend housing cover is removeable, wherein the backend housing cover is configured to couple to a mount of the mechanical output, and wherein the backend housing cover includes an at least one cutout and a removeable cutout cover configured to cover the at least one cutout.

20. A method comprising:
determining, by an at least one processor, whether to start a power converter of an electrical package, wherein the electrical package comprises:
at least one battery,
at least one electrical motor,
a battery charger used to charge the at least one battery,
the power converter,
a cooling system,
a backend coupled to the at least one electrical motor, the backend comprising:
a backend housing, wherein the backend housing comprises a backend housing cover, and
a pulley within the backend housing, wherein the backend housing cover is configured to cover the pulley;
a mechanical output extending through the backend housing cover; and
a control system comprising the at least one processor and a non-transitory computer readable medium, wherein the non-transitory computer readable medium has instructions stored thereon; and
determining, by the at least one processor, whether to start the cooling system of the electrical package.

\* \* \* \* \*